(12) United States Patent
Zhang et al.

(10) Patent No.: US 9,530,691 B1
(45) Date of Patent: Dec. 27, 2016

(54) METHODS, APPARATUS AND SYSTEM FOR FORMING A DIELECTRIC FIELD FOR DUAL ORIENTATION SELF ALIGNED VIAS

(71) Applicant: GLOBALFOUNDRIES INC., Grand Cayman (KY)

(72) Inventors: Xunyuan Zhang, Albany, NY (US); Errol Todd Ryan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/048,280

(22) Filed: Feb. 19, 2016

(51) Int. Cl.
| | |
|---|---|
| *H01L 21/8242* | (2006.01) |
| *H01L 21/768* | (2006.01) |
| *H01L 21/311* | (2006.01) |
| *H01L 21/02* | (2006.01) |
| *H01L 21/3105* | (2006.01) |
| *H01L 21/288* | (2006.01) |
| *H01L 21/66* | (2006.01) |
| *H01L 21/67* | (2006.01) |

(52) U.S. Cl.
CPC ..... *H01L 21/76897* (2013.01); *H01L 21/0217* (2013.01); *H01L 21/02142* (2013.01); *H01L 21/02164* (2013.01); *H01L 21/02175* (2013.01); *H01L 21/02244* (2013.01); *H01L 21/02255* (2013.01); *H01L 21/288* (2013.01); *H01L 21/31055* (2013.01); *H01L 21/31111* (2013.01); *H01L 21/67075* (2013.01); *H01L 21/67098* (2013.01); *H01L 21/67253* (2013.01); *H01L 21/76832* (2013.01); *H01L 21/76834* (2013.01); *H01L 21/76877* (2013.01); *H01L 22/20* (2013.01)

(58) Field of Classification Search
CPC ............................................... H01L 21/823807
See application file for complete search history.

(56) References Cited

U.S. PATENT DOCUMENTS

| | | | | |
|---|---|---|---|---|
| 6,635,525 B1 * | 10/2003 | Mandelman | ............ | H01L 21/84 257/E21.396 |
| 7,344,962 B2 * | 3/2008 | Anderson | ......... | H01L 21/82380 257/E21.633 |
| 7,799,609 B2 * | 9/2010 | Anderson | ......... | H01L 21/82380 257/74 |

* cited by examiner

*Primary Examiner* — Zandra Smith
*Assistant Examiner* — Andre' C Stevenson
(74) *Attorney, Agent, or Firm* — Williams Morgan, P.C.

(57) ABSTRACT

At least one method, apparatus and system disclosed herein for forming an integrated circuit having a dual-orientation self aligned via. A first dielectric layer is formed on a semiconductor substrate. At least one first metal feature is formed in a first metal layer. A first cap feature is deposited over the first metal feature. A manganese silicate etch stop layer is formed above the dielectric layer. An etch process is performed for removing for at least removing the first cap feature. A second metal feature is formed in a second metal layer. A dual-orientation self aligned via connecting a portion of the second metal feature to the first metal feature is formed.

20 Claims, 7 Drawing Sheets

METHODS, APPARATUS AND SYSTEM FOR FORMING A DIELECTRIC FIELD FOR DUAL ORIENTATION SELF ALIGNED VIAS

BACKGROUND OF THE INVENTION

Field of the Invention

Generally, the present disclosure relates to the manufacture of sophisticated semiconductor devices, and, more specifically, to providing for raising a dielectric field when forming dual-orientation self-aligned vias.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. Designers use self-aligned vias (SAVs) for process efficiency and to manufacture more dense devices.

FIG. 1 illustrates a stylized cross-sectional depiction of a state-of-the-art single-orientation, self-aligned via being formed between two metal layers. In order to form an integrated circuit device, a first layer ultra low dielectric constant (k) (i.e., first ULK layer 110a) material is deposited on a substrate 105. Metal features (150a, 150b) in the M1 metal layer are formed within the first ULK layer 110a. A carbon-doped silicon nitride sublayer 140 (e.g., NBLoK, a trademark of Applied Materials, Inc.) may be formed above the first ULK layer 110a.

A second ULK layer 110b is formed above the sublayer 140. Further, an M2 metal feature 120 may be formed in the second ULK layer 110b. In many cases, a connection from the M2 feature 120 and the second M1 feature 150b is desired. As such, a via 130 is formed in the second ULK layer 110b to connect the M2 feature 120 and the second M1 feature 150b. The via 130 is formed as a single-orientation self aligning to the M2 feature 120.

One of the problems associated with this state-of-the-art design is that an increased process margin is required to prevent an inadvertent coupling of the via 130 with the first M1 feature 150a. This increased process margin interferes with the ability to create more densely populated integrated circuits. Another problem includes the fact that an interface diffusion path exists at the edge of the via 130 in the sublayer 140. In order to address these problems, designers have resorted to implementing dual-orientation self-aligning vias.

FIG. 2 illustrates a stylized cross-sectional depiction of a state-of-the-art dual-orientation, self-aligned via being formed between two metal layers. FIG. 2 illustrates a first ULK 110a deposited on a substrate 105. Metal features (150a, 150b) in the M1 metal layer are formed within the first ULK layer 110a. In contrast to FIG. 1, a hard mask layer 260 (e.g., tetraethyl orthosilicate (TEOS) layer) is formed over the first ULK 110a. The hard mask layer 260 is formed to reduce time dependent dielectric breakdown (TDDB). However, this may cause a degradation of RC. The hard mask layer 260 is provided to reduce the diffusion path of features (e.g., via) formed above the hard mask layer 260. Gaps in the hard mask layer 260 are formed above the M1 features 150a, 150b. A metal recess process is performed to create a gap in the hard mask layer 260. This process may leave a residue 250 of metal material on the sidewalls of the gaps of the hard mask layer 260.

A thicker carbon-doped silicon nitride sublayer 140 may be formed above the hard mask layer 260 and between gaps of the hard mask layer 260. A second ULK layer 110b is formed above the sublayer 140. Further, an M2 metal feature 120 may be formed in the second ULK layer 110b. A connection from the M2 feature 120 and the second M1 feature 150b is provided by forming a via 230 in the second ULK layer 110b. The via 230 is formed as a dual-orientation self aligning to the M2 feature 120. One orientation of the via 230 is self-aligned to the M2 feature 120, while the second orientation is self-aligned to the second M1 feature 150b. The critical dimension of the bottom portion of the via 230 is matched to dimension of the second M1 feature 150b to reduce overlay impact between the via 230 and the second M1 feature 150b.

Although there is an improvement in the diffusion path problem in the dual-orientation via implementation, there are other problems associated with this design. For example, a portion of the via 230 lands on the hard mask, which may cause process errors. Further, the process margin has to be increased to accommodate the portion of the via 230 that would land on the hard mask. Therefore, the hard mask 260 is required to be sufficiently thick to prevent overflow problems. This causes difficulties in manufacturing smaller integrated circuit devices.

Further, using state of the art processes, it is difficult to properly recess the metal material (e.g., copper) of the M1 metal features on the side walls of the recess area. As such, the residue 250 of metal material remains in the recess area above the M1 metal features 150a, 150b. It would be desirable in the state of the art to have a process of efficiently and accurately manufacturing dual-orientation, self aligned vias while properly forming recess areas above metal features and reducing sidewall residue in hard masks.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming an integrated circuit having a dual-orientation self aligned via. A first dielectric layer is formed on a semiconductor substrate. At least one first metal feature is formed in a first metal layer. A first cap feature is deposited over the first metal feature. A manganese silicate etch stop layer is formed above the dielectric layer. An etch process is performed for removing for at least removing the first cap feature. A second metal feature is formed in a second metal layer. A dual-orientation self aligned via connecting a portion of the second metal feature to the first metal feature is formed.

BRIEF DESCRIPTION OF THE DRAWINGS

The disclosure may be understood by reference to the following description taken in conjunction with the accompanying drawings, in which like reference numerals identify like elements, and in which.

Figure 1:
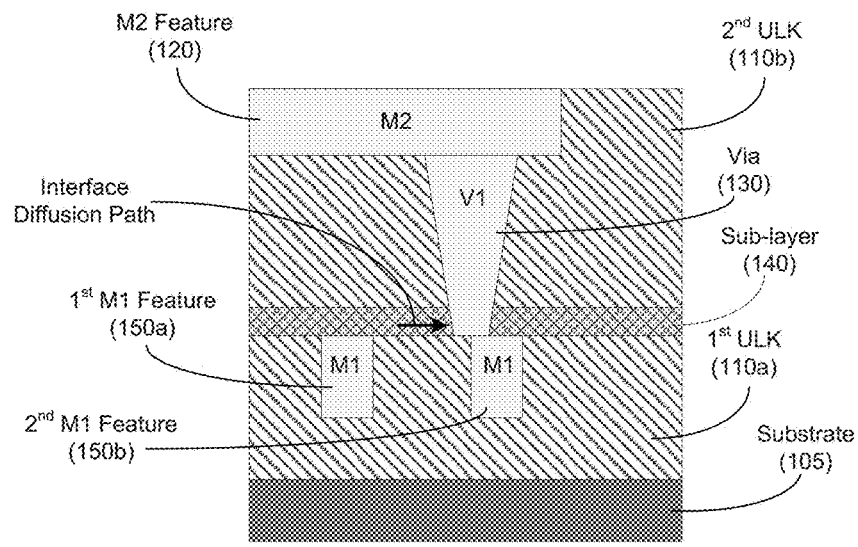
FIG. 1 illustrates a stylized cross-sectional depiction of a state-of-the-art single-orientation, self-aligned via being formed between two metal layers.
Figure 2:
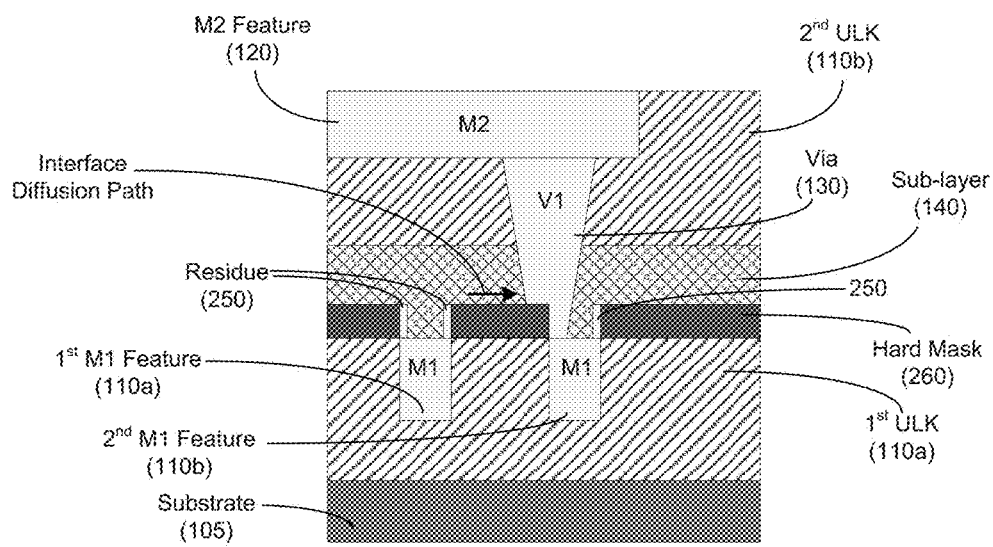
FIG. 2 illustrates a stylized cross-sectional depiction of a state-of-the-art dual-orientation, self-aligned via being formed between two metal layers.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figs. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiment herein provide for processing a semiconductor wafer having a dual-orientation self aligned via (DO-SAV). Embodiments herein provide for forming a hard mask layer above metal features during the process of forming DO-SAVs. Embodiments herein provide for using certain materials that may reduce metal material residue on the sidewalls of hard mask gaps above the metal features. Embodiments herein provide for bypassing a metal recess process by forming a hard mask layer only on a dielectric material above metal features. Embodiments herein provide for forming a manganese silicate etch stop layer for performing deposition and etch processes to form DO-SAVs.

Figure 3:
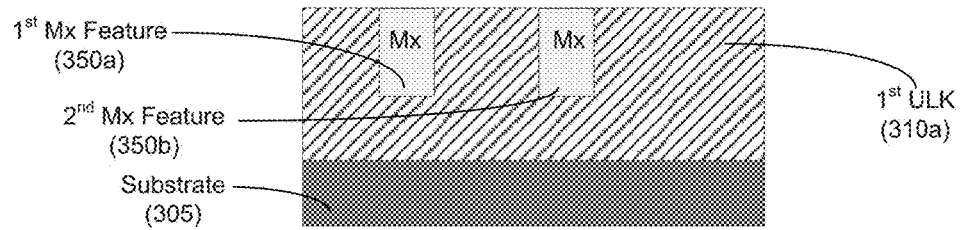
FIGS. 3-14 illustrate stylized depictions of various processing steps performed on a semiconductor wafer for forming dual-orientation self aligned vias, in accordance with embodiments herein.

FIGS. 3-14 illustrate stylized depictions of various processing steps performed on a semiconductor wafer for forming dual-orientation self aligned vias, in accordance with embodiments herein. Turning now to FIG. 3, in order to form an integrated circuit device, a first layer ultra low dielectric constant (k) (i.e., first ULK layer 310a) material is deposited on a substrate 305. Metal features (350a, 350b) in an Mx metal layer (e.g., M1 metal layer) are formed within the first ULK layer 310a. In one embodiment, metal features (350a, 350b) may be formed using copper.

Figure 4:
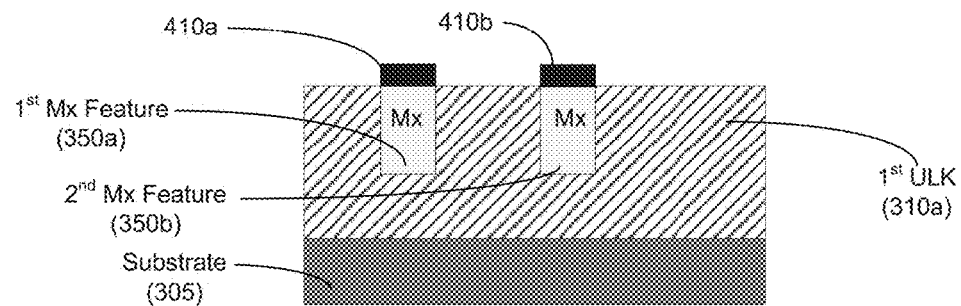

As shown in FIG. 4, a first cobalt cap 410a and a second cobalt cap 410b may be selectively deposited respectively on the first and second metal features 350a, 350b. The cobalt caps 410a, 410b may be a 5 nm cap, and may be deposited onto the metal features 310a, 310b using a chemical vapor deposition (CVD) or atomic layer deposition (ALD) process, or alternatively, an electroless processing using current POR process. In one embodiment, the thickness of the cobalt caps 410a, 410b may be about 5 nm. In another embodiment, the thickness of the cobalt caps 410a, 410b may be in the range between about 3 nm to about 10 nm.

Figure 5:
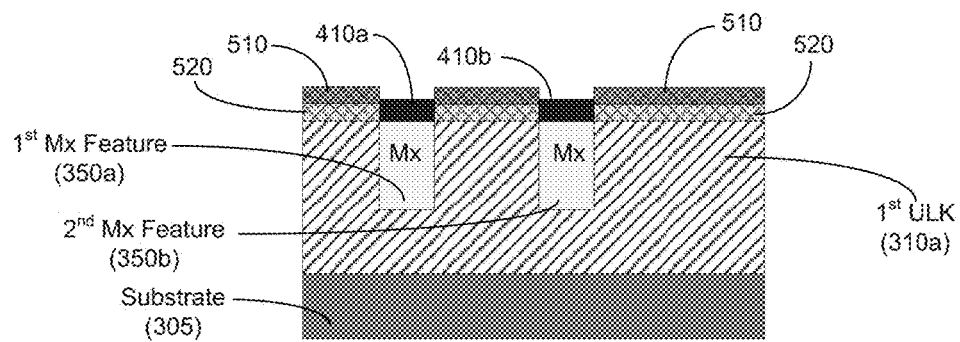

As shown in FIG. 5, a metallic manganese layer 510 may be deposited above the ULK layer 310a and the cobalt caps 410a, 410b. The manganese layer 510 may be deposited using a CVD process or an atomic layer deposition (ALD) process. These deposition processes may be performed at a high growth temperature range (e.g., between about 200° C. to about 400° C.).

A portion of the manganese layer 510 may react with the ULK layer 310a, forming a manganese silicate $MnSiO_3$ layer 520. The $MnSiO_3$ layer 520 is a self-forming layer and is characterized by self-limiting growth to about 3 nm based on a 2 nm manganese layer 510. Therefore, a layer of $MnSiO_3$ layer 520 will form on the ULK layer 310a, and the manganese layer will be on top of the $MnSiO_3$ layer 520. The manganese material on top of the cobalt caps 410a, 410b will diffuse away due to thermal energy and/or may be driven out by oxygen. However, the $MnSiO_3$ layer 520 may not be thick enough, as its 3 nm thickness may be within CMP process error margins. That is, the $MnSiO_3$ layer 520 and the manganese layer 510 are not topographically high enough for forming a via.

Figure 6:
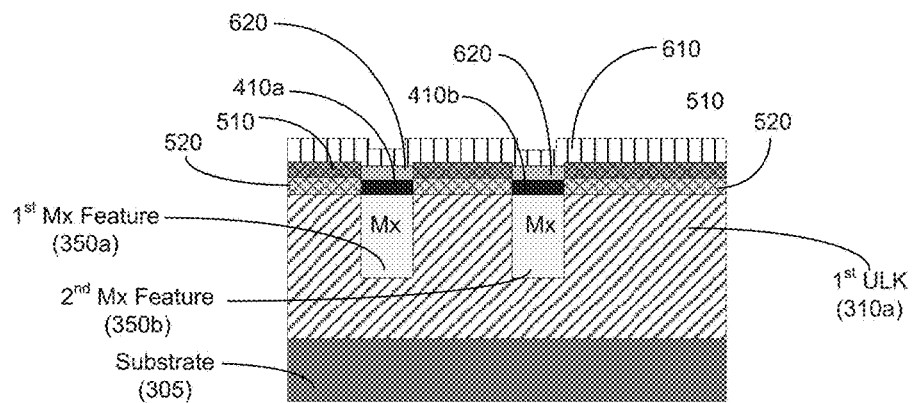

Accordingly, additional dielectric structures may be formed. As shown in FIG. 6, a silicon oxide layer 610 may be formed above the manganese layer 510 and the cobalt caps 410a, 410b. In one embodiment, the silicon oxide layer 610 may be deposited using a CVD process or an ALD process. The silicon oxide material may react with the cobalt caps 410a, 410b and form thin cobalt oxide layers 620. The cobalt oxide layers 620 may each be about 2 nm-3 nm thick. In addition to the cobalt caps 410a, 410b, the cobalt oxide layers 620 may also assist in protecting the metal material (e.g., copper) in the Mx features 350a, 350b from oxidation.

Figure 7:
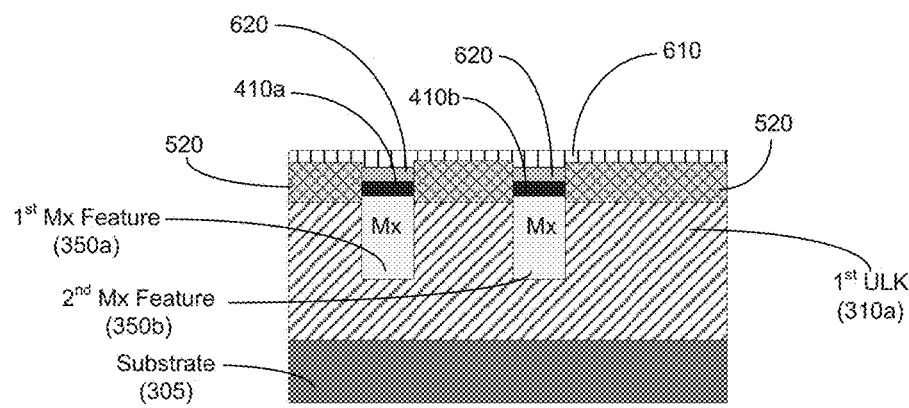

Next, a thermal anneal process at about 250-450° C. may be performed. As shown in FIG. 7, a reduction in the silicon oxide layer 610 may take place. Additionally, the thermal energy from the anneal process may transform the manganese layer 510 into manganese silicate. Therefore, after the thermal anneal process, the manganese layer 510 becomes $MnSiO_3$ and combines with the layer 520, thus, the $MnSiO_3$ layer 520 becomes thicker.

Figure 8:
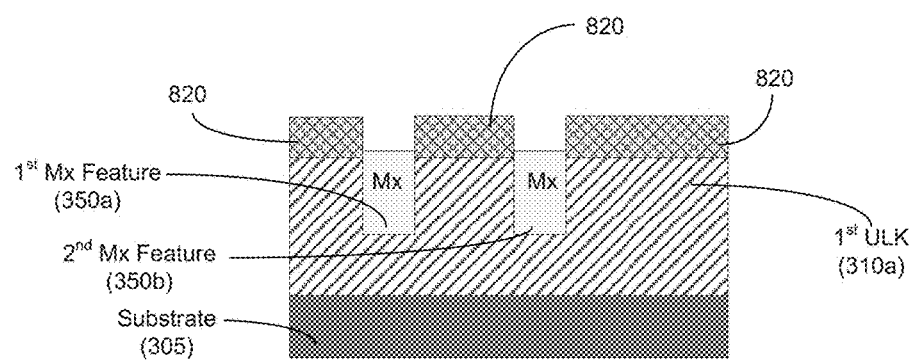

Subsequently, a wet etch process (e.g., an HF etch process) may be performed on the semiconductor wafer. The wet etch process removes the silicon oxide material of the silicon oxide layer 610, as shown in FIG. 8. Further, the cobalt oxide layers 620, as well as the cobalt caps 410a, 410b are removed by this process. The wet etch process does not remove any portion of the metal material (e.g., copper) in the metal features 350a, 350b. At this point, the dielectric field is raised at least about 3 nm above the surface of the Mx features 350a, 350b. That is, a thicker layer of $MnSiO_3$ material is self-created to form a thicker dielectric layer, i.e., $MnSiO_3$ layer 820. Therefore, a manganese silicate etch stop layer is formed.

Next, in some embodiments, the steps described in FIGS. 5-8 may be repeated as necessary. A determination may be made as to whether the manganese silicate etch stop layer has sufficient dimensions for further processing. If a determination is made that additional height/thickness of the manganese silicate etch stop layer is required, the steps described in FIGS. 5-8 may be repeated until sufficient dimension for the manganese silicate etch stop layer is formed.

Figure 9:
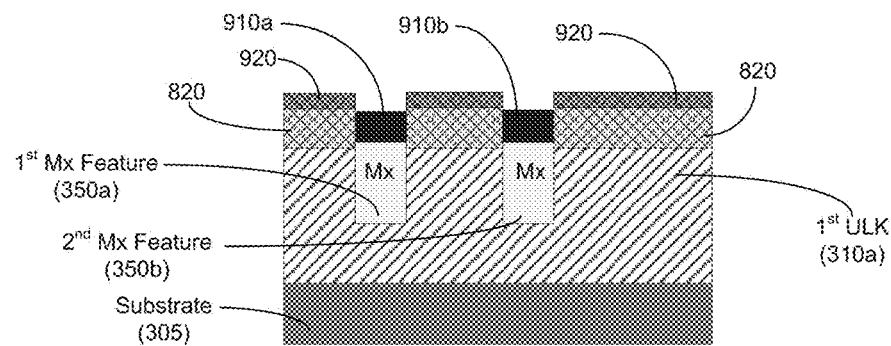

As illustrated in FIG. 9, cobalt caps 910a, 910b may be deposited above the Mx features 350a, 350b and the ULK layer 310a. The cobalt caps 910a, 910b may be about 5 nm in thickness. Also, another manganese layer 920 may be deposited above the $MnSiO_3$ layers 820. The manganese layer 920 may be deposited to a thickness of about 2 nm using a CVD or an ALD process. As described above, the manganese on the top portions of the metal features 310a, 310b will diffuse away due to thermal energy, and/or may be driven out by oxygen.

Figure 10:
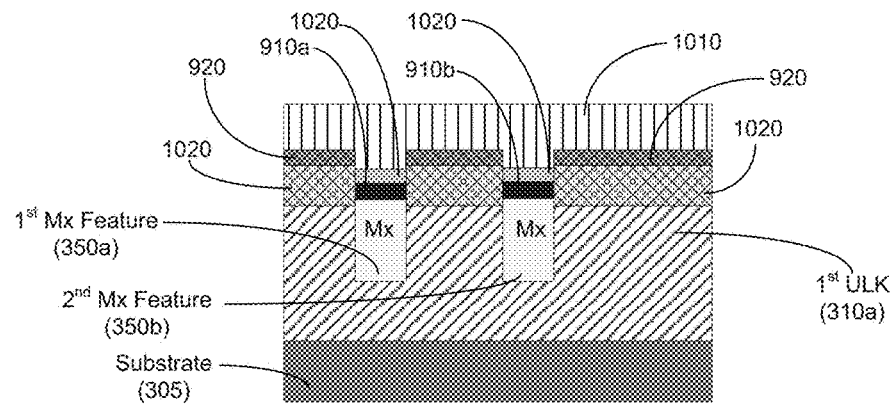

As shown in FIG. 10, another silicon oxide layer 1010 may be formed above the manganese layer 920 and the cobalt caps 910a, 910b. In one embodiment, the silicon oxide layer 1010 may be deposited using a CVD process or an ALD process. The silicon oxide material may react with the cobalt caps 910a, 910b and form thin cobalt oxide layers 920. The cobalt oxide layers 920 may each be about 2 nm-3 nm thick.

Figure 11:
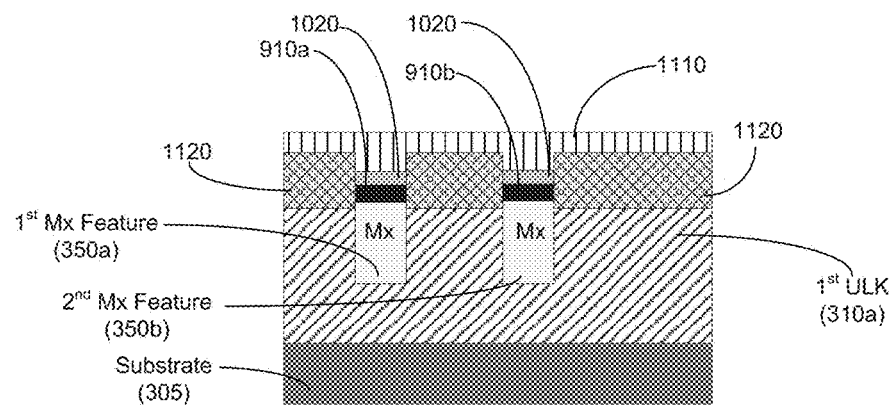

A thermal anneal process at about 250-450° C. may then be performed. As shown in FIG. 11, a reduction in the silicon oxide layer 1010 may take place. Additionally, the thermal energy from the anneal process may transform the manganese layer 920 into additional manganese silicate material. Therefore, as result of the thermal anneal process, the manganese layer 1010 is converted to additional $MnSiO_3$ material that is added to the $MnSiO_3$ layer 1020 of FIG. 10. This results in a thicker $MnSiO_3$ layer 1120, as shown in FIG. 11.

Figure 12:
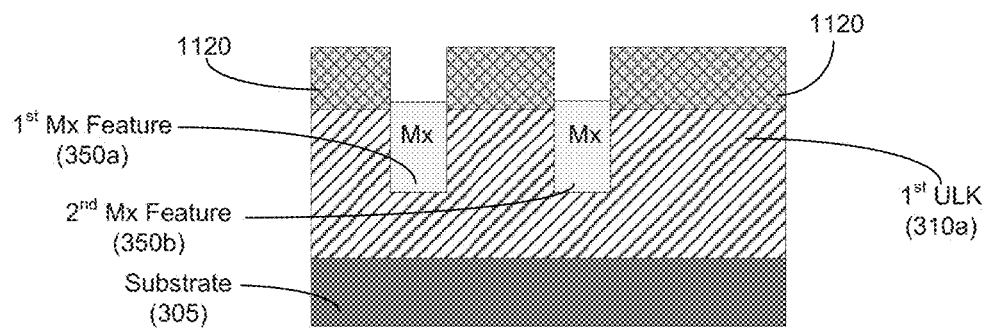

Subsequently, a wet etch process (e.g., an HF etch process) may again be performed on the semiconductor wafer. The wet etch process removes the silicon oxide material of the silicon oxide layer 1110, as shown in FIG. 12. Further, the cobalt oxide layers 920, as well as the cobalt caps 910a, 910b are removed by this process. The wet etch process does not remove any portion of the metal material (e.g., copper) in the metal features 350a, 350b. At this point, the dielectric field is raised at least about 6 nm above the surface of the Mx features 350a, 350b. In some embodiments, the thickness of the dielectric field may be between about 5 nm to about 10 nm.

Accordingly, a thicker layer of $MnSiO_3$ material is self-created to form a thicker dielectric layer, i.e., $MnSiO_3$ layer 1120. Therefore, an etch stop layer that is highly selective and having sufficient dimensions (height/thickness) for performing further processing for forming additional metal features (e.g., DO-SAVs), is provided.

Figure 13:
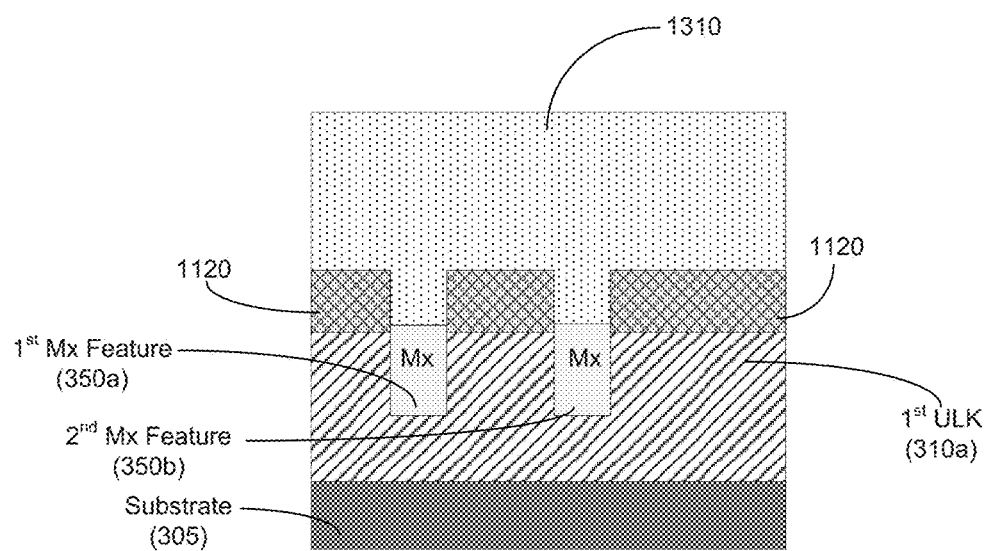

As shown in FIG. 13, a dielectric cap deposition process may be performed. In this process, a layer 1310 of dielectric cap material (e.g., silicon nitride) may be deposited over the $MnSiO_3$ layer 1120 and the Mx features 350a, 350b. Further, additional process steps known to those skilled in the art having benefit of the present disclosure may be performed. For example, additional process steps, such as deposition of additional ULK material, lithography processes, etching process, pattern layer deposition (i.e., hard mask layer deposition) process, further lithography/etching processes, metal (e.g., copper) deposition processes, plating processes, CMP process, etc., may be performed.

Figure 14:
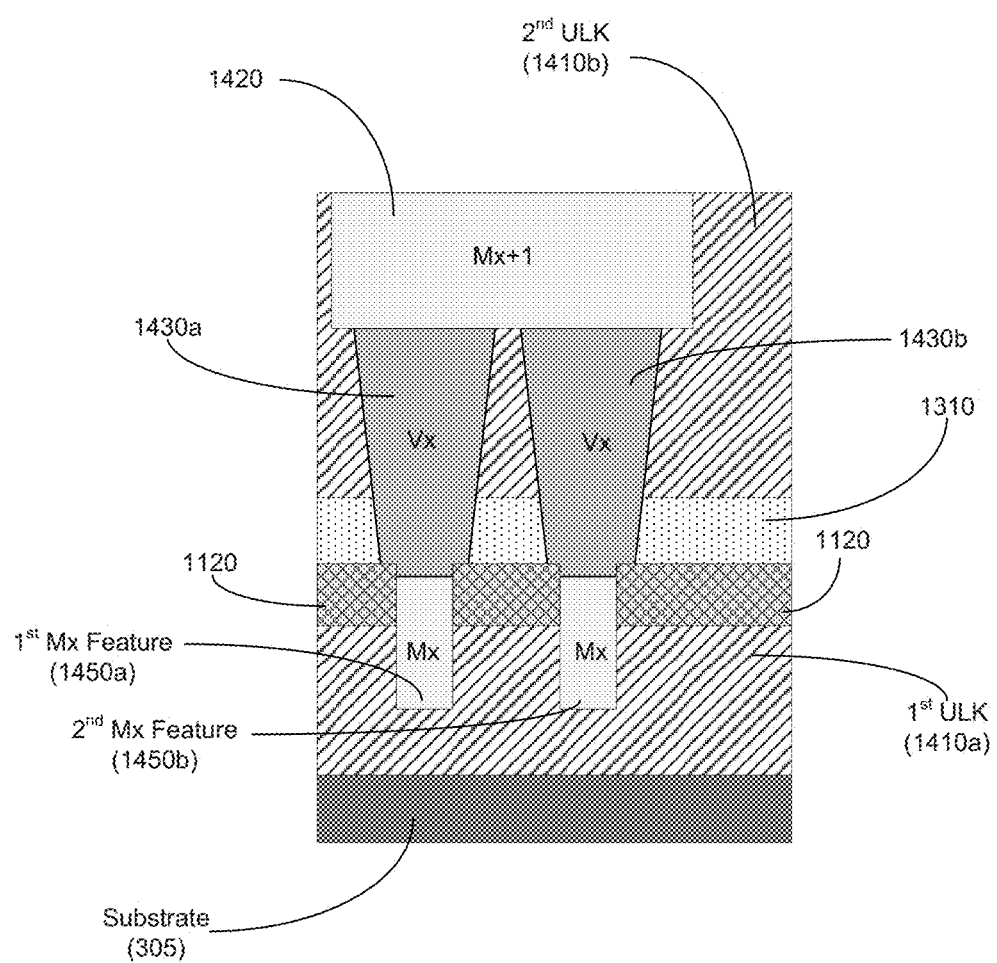

Based on these additional processes, for example as shown in FIG. 14, a second ULK layer 1410 may be formed. A subsequent Mx+1 metal layer (e.g., M2 layer) may be formed in the ULK layer 1410. For example, a metal feature 1420 may be formed. In some embodiments, it may be desirable to couple the metal feature 1420 with the metal features 350a, 350b. As such, dual-orientation self aligned (DO-SAV) vias 1430a and 1430b may be formed. The DO-SAV vias 1430a, 1430b may electrically couple the metal feature 1420 to the metal features 350a, 350b.

The DO-SAV vias 1430a, 1430b may be self aligned to the metal feature 1420, as well as to the metal features 350a, 350b. Therefore, using processes provided by embodiments herein, a plurality of DO-SAV vias may be formed by bypassing a metal recess process by forming a hard mask layer only on a dielectric material above metal features. Further, embodiments herein provide for substantially eliminating reduce metal material residue on the sidewalls of hard mask gaps above metal features.

Figure 15:
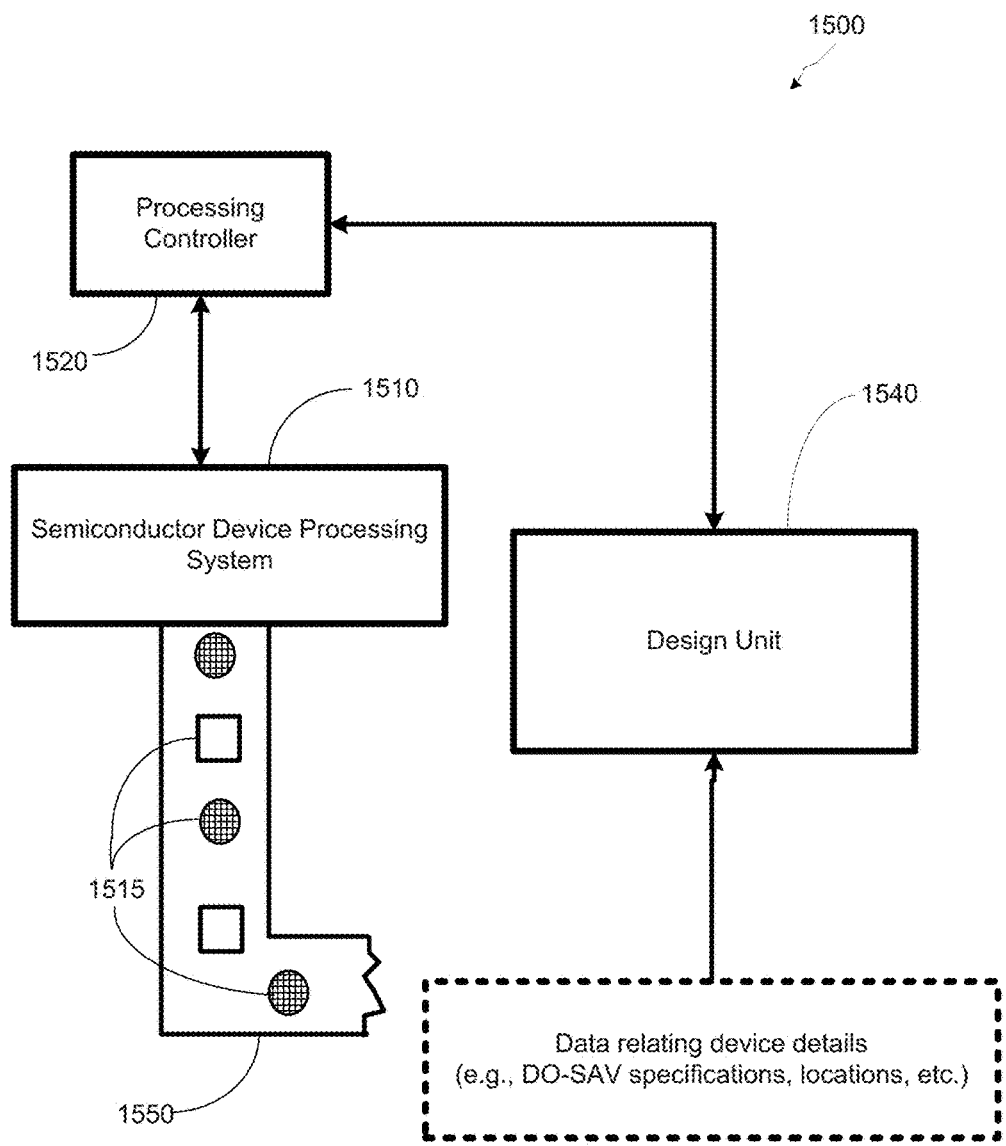
FIG. 15 illustrates a stylized depiction of a system for fabricating an integrated circuit having an DO-SAV, in accordance with embodiments herein.

Turning now to FIG. 15, a stylized depiction of a system for fabricating a semiconductor device having a dual-orientation self aligned via, in accordance with embodiments herein, is illustrated. The system 1500 of FIG. 15 may comprise a semiconductor device processing system 1510 and a design unit 1540. The semiconductor device processing system 1510 may manufacture integrated circuit devices having a dual-orientation self aligned via based upon one or more designs provided by the design unit 1540. The designs provided by the design unit 1540 may comprise various details regarding dimensions and locations of a plurality of dual-orientation self aligned vias, similar to those described above.

The semiconductor device processing system 1510 may comprise various processing stations, such as etch process stations, photolithography process stations, CMP process stations, etc. that are capable of performing various processes for manufacturing semiconductor devices, including processes described above. One or more of the processing steps performed by the processing system 1510 may be controlled by the processing controller 1520. The processing controller 1520 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1510 may produce integrated circuits on a medium, such as silicon wafers. More particularly, the semiconductor device processing system 1510 produce integrated circuits having dual-orientation self aligned vias, as described above.

The production of integrated circuits by the device processing system 1510 may be based upon the circuit designs provided by the design unit 1540. The processing system 1510 may provide processed integrated circuits/devices 1515 on a transport mechanism 1550, such as a conveyor system. In some embodiments, the conveyor system may be sophisticated clean room transport systems that are capable of transporting semiconductor wafers. In one embodiment, the semiconductor device processing system 1510 may comprise a plurality of processing steps, e.g., the $1^{st}$ process step, the $2^{nd}$ process set, etc., as described above.

In some embodiments, the items labeled "1515" may represent individual wafers, and in other embodiments, the items 1515 may represent a group of semiconductor wafers, e.g., a "lot" of semiconductor wafers. The integrated circuit or device 1515 may be a transistor, a capacitor, a resistor, a memory cell, a processor, and/or the like. In one embodiment, the device 1515 is a transistor and the dielectric layer is a gate insulation layer for the transistor.

The integrated circuit design unit 1540 of the system 1500 is capable of providing a circuit design that may be manufactured by the semiconductor processing system 1510. The integrated circuit design unit 1540 may receive various types of data including performance data, device specification, DO-SAV specification, etc. Using such data, the design unit 1540 may provide various process definitions based on the data that includes performance data, device specification, etc. Based upon such details of the devices, the integrated circuit design unit 1540 may determine specifications of the devices that are to be manufactured using the processes described above. Based upon these specifications, the design unit 1540 may provide data for manufacturing a semiconductor device package described herein.

The system 1500 may be capable of performing analysis and manufacturing of various products involving various technologies. For example, the system 1500 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first dielectric layer on a semiconductor substrate;
   forming at least one first metal feature in a first metal layer;
   depositing a first cap feature over said first metal feature;
   forming a manganese silicate etch stop layer above said dielectric layer;
   performing an etch process for removing at least removing said first cap feature;
   forming a second metal feature in a second metal layer; and
   forming a dual-orientation self aligned via connecting a portion of said second metal feature to said first metal feature.

2. The method of claim 1, wherein forming a manganese silicate etch stop layer comprises:
   depositing a first metallic manganese layer over said first dielectric layer and said first cap feature; and
   providing thermal energy for converting a portion of said metallic first manganese layer to a first manganese silicate layer.

3. The method of claim 2, wherein providing said thermal energy comprises performing a thermal anneal process at a temperature in the range of about 250° C. to about 450° C.

4. The method of claim 1, further comprising depositing a first silicon oxide layer over said first manganese silicate etch stop layer and said first cap feature.

5. The method of claim 4, further comprising forming a cobalt oxide layer over said first cap feature by partially oxidizing said first cap feature.

6. The method of claim 1, wherein forming at least one of said second metal feature and said DO-SAV comprises:
   forming a silicon nitride layer over said manganese silicate layer and said first metal feature,
   performing a first chemical-mechanical polishing (CMP) process on said silicon nitride layer;
   performing a pattern layer deposition process for pattering at least one of said second metal feature and said DO-SAV;
   performing a lithography process based on said pattern layer;
   performing a metal deposition process for depositing metal material for forming at least one of said second metal feature and said DO-SAV;
   performing a plating process on said metal material; and
   performing a second CMP process for forming at least one of said second metal feature and said DO-SAV.

7. The method of claim 1, further comprising determining whether at least one dimension of said manganese silicate etch stop layer is sufficient for further processing.

8. The method of claim 7, increasing said dimension of said manganese silicate etch stop layer in response to determining that said at least one dimension of said manganese silicate etch stop layer is not sufficient for further processing, wherein increasing said dimension comprises:
   depositing a second cap feature over said first metal feature;
   depositing additional metallic manganese material over said first manganese silicate etch stop layer and said second cap feature;
   providing thermal energy for converting a portion of said metallic manganese material into a second manganese silicate layer;
   depositing a first silicon oxide layer over said second manganese layer; and performing an etch process for removing said silicon oxide layer and said second cap feature.

9. The method of claim 8, wherein increasing said dimension of said manganese silicate etch stop layer comprises forming said manganese silicate etch stop layer to a thickness in the range of about 5 nm to about 10 nm.

10. The method of claim 1, wherein performing said etch process comprises performing a HF wet etch process.

11. A method, comprising:
forming a first dielectric layer on a semiconductor substrate;
forming at least one first metal feature in a first metal layer;
depositing a first cap feature over said first metal feature;
depositing a first metallic manganese layer over said first dielectric layer and said first cap feature;
providing thermal energy for converting a portion of said first metallic manganese layer to a first manganese silicate layer;
depositing a first silicon oxide layer over said first manganese layer
performing an etch process for removing said silicon oxide layer and said cap feature;
forming a second metal feature in a second metal layer; and
forming a dual-orientation self aligned via (DO-SAV) connecting a portion of said second metal feature to said first metal feature.

12. The method of claim 11, further comprising:
depositing a second cap feature over said first metal feature;
depositing a second metallic manganese layer over said first manganese layer and said second cap feature;
providing thermal energy for converting a portion of said second metallic manganese layer into manganese silicate material for increasing the thickness of said first manganese silicate layer;
depositing a second silicon oxide layer over said first manganese layer; and
performing an etch process for removing said second silicon oxide layer and said second cap feature for providing a manganese silicate etch stop layer.

13. The method of claim 11, wherein providing said thermal energy comprises performing a thermal anneal process at a temperature in the range of about 250° C. to about 450° C.

14. The method of claim 11, further comprising forming a cobalt oxide layer over said first cap feature by causing said first cap feature to become partially oxidized.

15. The method of claim 1, wherein forming at least one of said second metal feature and said DO-SAV comprises:
forming a silicon nitride layer over said first manganese silicate layer and said first metal feature,
performing a first chemical-mechanical polishing (CMP) process on said silicon nitride layer;
performing a pattern layer deposition process for pattering at least one of said second metal feature and said DO-SAV;
performing a lithography process based on said pattern layer;
performing a metal deposition process for depositing metal material for forming at least one of said second metal feature and said DO-SAV;
performing a plating process on said metal material; and
performing a second CMP process for forming at least one of said second metal feature and said DO-SAV.

16. A system, comprising:
a semiconductor device processing system to manufacture a semiconductor device comprising at least one dual-orientation self aligned via; and
a processing controller operatively coupled to said semiconductor device processing system, said processing controller configured to control an operation of said semiconductor device processing system;
wherein said semiconductor device processing system is adapted to:
form a first dielectric layer on a semiconductor substrate;
form at least one first metal feature in a first metal layer;
deposit a first cap feature over said first metal feature;
form a manganese silicate etch stop layer above said dielectric layer;
perform an etch process for removing at least removing said first cap feature;
form a second metal feature in a second metal layer; and
form a dual-orientation self aligned via connecting a portion of said second metal feature to said first metal feature.

17. The system of claim 16, further comprising a design unit configured to generate a first design comprising a definition for an integrated circuit having at least one DO-SAV, wherein data from said design unit is used by said process controller to control an operation of said semiconductor device processing system.

18. The system of claim 16, wherein said semiconductor device processing system is further adapted to:
deposit a first metallic manganese layer over said first dielectric layer and said first cap feature; and
provide thermal energy for converting a portion of said metallic first manganese layer to a first manganese silicate layer.

19. The system of claim 16, wherein said semiconductor device processing system is further adapted to:
determine whether at least one dimension of said manganese silicate etch stop layer is sufficient for further processing; and
increase said dimension of said manganese silicate etch stop layer in response to determining that said at least one dimension of said manganese silicate etch stop layer is not sufficient for further processing, wherein increasing said dimension of said manganese silicate etch stop layer comprises:
depositing a second cap feature over said first metal feature;
depositing additional metallic manganese material over said first manganese silicate etch stop layer and said second cap feature;
providing thermal energy for converting a portion of said metallic manganese material into a second manganese silicate layer;
depositing a first silicon oxide layer over said second manganese layer; and
performing an etch process for removing said silicon oxide layer and said second cap feature.

20. The system of claim 16, wherein said semiconductor device processing system is further adapted to:
form a silicon nitride layer over said manganese silicate layer and said first metal feature,
perform a first chemical-mechanical polishing (CMP) process on said silicon nitride layer;

perform a pattern layer deposition process for pattering at least one of said second metal feature and said DO-SAV;

perform a lithography process based on said pattern layer;

perform a metal deposition process for depositing metal material for forming at least one of said second metal feature and said DO-SAV;

perform a plating process on said metal material; and perform a second CMP process for forming at least one of said second metal feature and said DO-SAV.

* * * * *